United States Patent
Subrahmanyam et al.

(10) Patent No.: US 12,169,180 B2
(45) Date of Patent: Dec. 17, 2024

(54) OPTICAL LEAK DETECTION OF LIQUID COOLING COMPONENTS WITHIN AN ELECTRONIC SYSTEM

(71) Applicant: Intel Corporation, Santa Clara, CA (US)

(72) Inventors: Prabhakar Subrahmanyam, San Jose, CA (US); Ying-Feng Pang, San Jose, CA (US); Yi Xia, Campbell, CA (US); Mark Bianco, Redwood City, CA (US); Victor Polyanko, Kent, WA (US)

(73) Assignee: Intel Corporation, Santa Clara, CA (US)

( * ) Notice: Subject to any disclaimer, the term of this patent is extended or adjusted under 35 U.S.C. 154(b) by 772 days.

(21) Appl. No.: 17/133,563

(22) Filed: Dec. 23, 2020

(65) Prior Publication Data

US 2021/0116391 A1    Apr. 22, 2021

(51) Int. Cl.
*G01N 21/952* (2006.01)
*H05K 1/02* (2006.01)
*H05K 7/20* (2006.01)

(52) U.S. Cl.
CPC ......... *G01N 21/952* (2013.01); *H05K 1/0203* (2013.01); *H05K 7/20218* (2013.01); *H05K 2201/10106* (2013.01); *H05K 2201/10151* (2013.01)

(58) Field of Classification Search
CPC .... G01M 3/04; G01M 3/38; G01N 2021/945; G01N 21/94; G01N 21/952; H05K 1/0203;
(Continued)

(56) References Cited

U.S. PATENT DOCUMENTS

2010/0170326 A1* 7/2010 Miller ................... G01M 3/227
 73/49.3
2015/0131228 A1* 5/2015 Ishikawa ............ H05K 7/20827
 361/699
(Continued)

FOREIGN PATENT DOCUMENTS

GB    2576032 B    4/2021
GB    2576030 B    12/2021
(Continued)

OTHER PUBLICATIONS

Kiatkamjornworn, Suda, "Superabsorbent Polymers and Superabsorbent Polymer Composites", Science Asia 33, Supplement 1 (2007) 5 pages.
(Continued)

*Primary Examiner* — Amy R Hsu
(74) *Attorney, Agent, or Firm* — Hanley, Flight & Zimmerman, LLC (57) ABSTRACT

An apparatus is described. The apparatus includes an electronic system having a printed circuit board with electronic components mounted thereon. At least some of the electronic components are coupled to components of a liquid cooling system. The electronic system has a light source and a photosensitive element. The light source is to illuminate an illuminated region of the printed circuit board and/or at least one of the electronic components. The photosensitive element is to detect a change in reflection from the illuminated region in response to the presence of coolant that has leaked from the liquid cooling system within the illuminated region.

20 Claims, 8 Drawing Sheets

(58) Field of Classification Search
CPC .......... H05K 2201/10106; H05K 2201/10151; H05K 7/20218; H05K 7/20327; H05K 7/20772
See application file for complete search history.

(56) References Cited

U.S. PATENT DOCUMENTS

2019/0145891 A1* 5/2019 Waxman ............ G01N 21/3504
356/409
2021/0320050 A1 10/2021 Robinson et al.

FOREIGN PATENT DOCUMENTS

| GB | 2597525 A | 2/2022 |
| GB | 2601357 A | 6/2022 |

OTHER PUBLICATIONS

Scudellari, Megan, "Meet the E-Nose That Actually Sniffs", The Human OS/Biomedical/Biomedical Devices, Oct. 26, 2018, 3 pages.
Shulaker et al., "Three-dimensional integration of nanotechnologies for computing and data storage on a single chip" Nature 547, pp. 74-78, 2017.
Trondle, et al. "Non-contact Optical Sensor to Detect Free Flying Droplets In The Nanolitre Range" Sensors and Actuators A:Physical, journal homepage: www.wlsevier.com/locate/sna, Feb. 11, 2010, 9 pages.
Zamora et al., Water Absorbing Balls: A "Growing" Problem, Pediatrics, vol. 130, No. 4, Oct. 2012.

\* cited by examiner

OPTICAL LEAK DETECTION OF LIQUID COOLING COMPONENTS WITHIN AN ELECTRONIC SYSTEM

BACKGROUND

As the performance of computing and/or networking systems continues to scale upward so does their internal operating temperatures. As such, systems designers are increasingly presented with thermal related hurdles and adapting the designs of their systems to overcome them.

FIGURES

A better understanding of the present invention can be obtained from the following detailed description in conjunction with the following drawings, in which.

DETAILED DESCRIPTION

Figure 1:
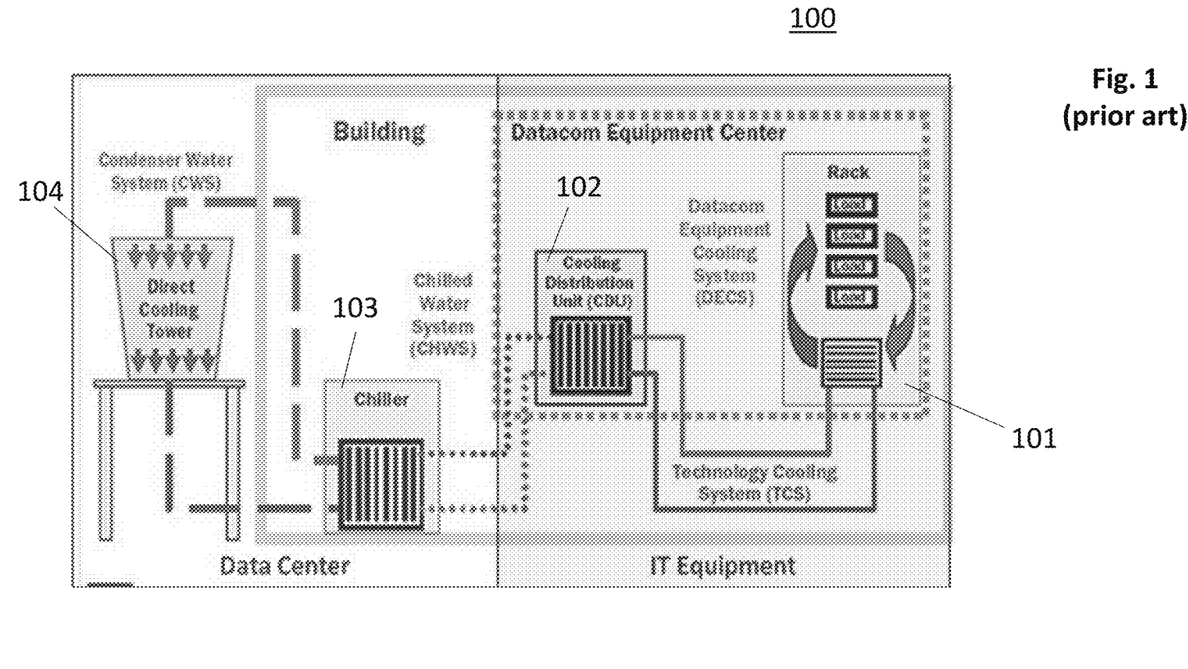
FIG. 1 shows a high performance computing environment (prior art)

FIG. 1 shows a high level depiction of a high performance computing environment 100 such as a centralized data center or cloud service nerve center. As observed in FIG. 1, multiple racks 101 each containing shelves of computing equipment are located in a confined area. Generally, information systems (IS) managers desire to pack large amounts of computing performance into small areas. Likewise, semiconductor chip manufacturers and computing equipment manufacturers attempt to densely integrate high performance functionality into their respective products.

As the performance of semiconductor chips (and the computing/networking systems that the chips are integrated into) continues to increase, however, so does the associated power consumption. Unfortunately, the performance of many semiconductor chips and computing/networking system products has crossed a threshold at which traditional air-cooling is unable to keep the chips/equipment sufficiently cool.

As such, liquid cooling solutions are steadily being integrated into today's computing/networking systems. Here, as observed in FIG. 2a, a computing system or networking system ("system"), such as a blade server, a disaggregated computing system CPU unit, a switching hub, etc., includes a number of semiconductor chips 201. The system also includes an inlet 202 to receive cooled fluid. Cold plates 203 are mechanically coupled to various semiconductor chips 201 within the system and the cooled fluid is routed, e.g., by way of one or more manifolds and conduit tubing, through the cold plates 203.

Figure 2A:
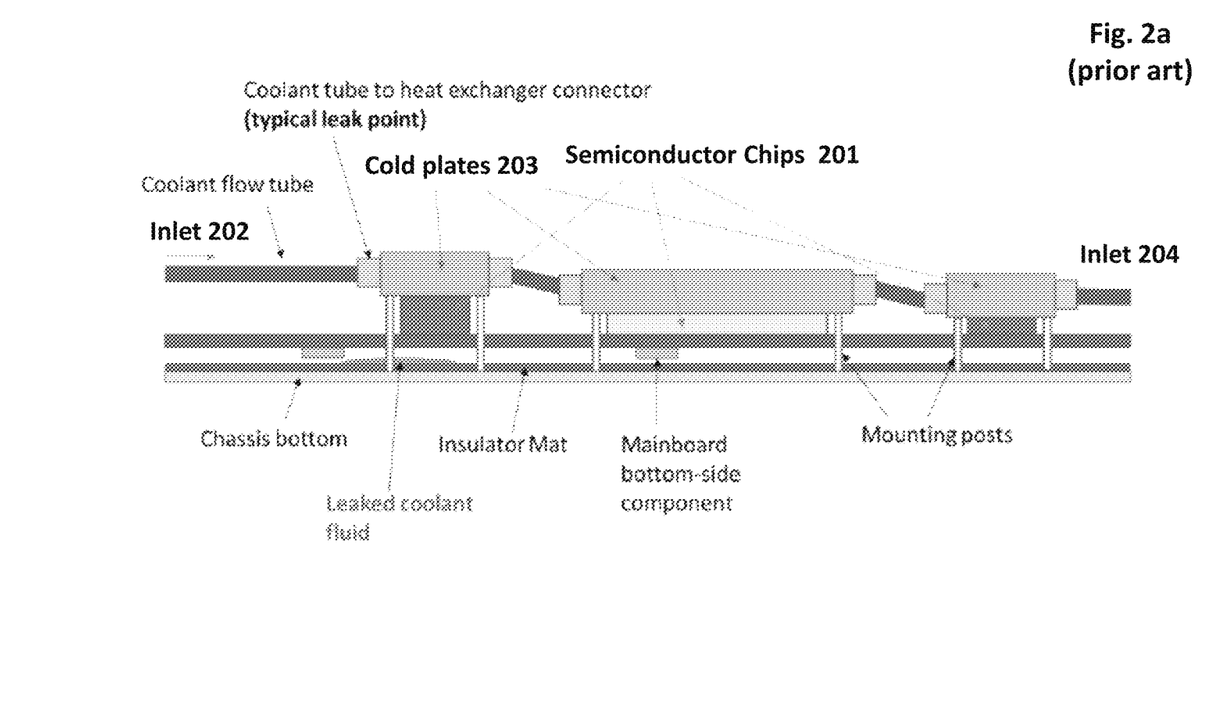
FIG. 2a shows an electronic system having components of a liquid cooling system (prior art)

As the semiconductor chips 201 operate they transfer heat to their respective cold plates 203, which, in turn, transfers the heat to the running fluid. The warmed fluid is then collected through one or more manifolds and tubing and routed to a warmed fluid outlet port 204. Note that although FIG. 2a depicts cold plates attached to the semiconductor chips 201, other liquid cooling solutions attach heat exchangers to the semiconductor chips 201. Both cold plates and heat exchangers have fluid input/output junctions as depicted.

As such, referring back to FIG. 1, the racks 101 within a high performance computing environment 100 not only include electrical interfaces and associated wiring to permit their various systems to communicate with other systems, but also, includes fluidic piping/channels to guide cooled/warmed fluids to/from these systems.

The warmed fluid emitted from the systems is drawn away from the racks and directed to a coolant distribution unit (CDU) 102. The CDU 102 acts as a first heat exchanger that receives cooled fluid from a chiller 103 and transfers heat from the fluid received by the racks 101 to the fluid received from the chiller 103. The removal of heat from the fluid received from the racks 101 cools the fluid which is then rerouted back to the racks 101 as cooled fluid. Likewise, the transfer of heat into the fluid received from the chiller 103 warms that fluid which is then routed back to the chiller 103.

The chiller 103 acts as a second heat exchanger that receives cooled fluid from a cooling tower 104. Heat is transferred from the warmed fluid received from the CDU 102 to the fluid received from the cooling tower 104. The removal of heat from the fluid received from the CDU 102 cools the fluid which is then routed back to the CDU 102 as cooled fluid. The transfer of heat warms the fluid received from the cooling tower 104 which is then routed back to the cooling tower 104 for cooling. The cooling tower 104 acts as a third heat exchanger that transfers heat from the fluid it receives to the ambient. This cools the fluid which is then routed back to the chiller 103.

A problem is that leaks can arise in the liquid cooling systems of, e.g., the CDU 102, the racks 101 and/or any of the systems that are plugged into the rack. Here, typically, the liquid coolant is electrically conductive and can cause damage (electrical shorts) if the coolant runs across electrical nodes, connections, wires, etc. As such, detection systems that detect fluid leaks are deemed a pertinent part of a successful transition from air cooled systems to fluid cooled systems.

Figure 2B:
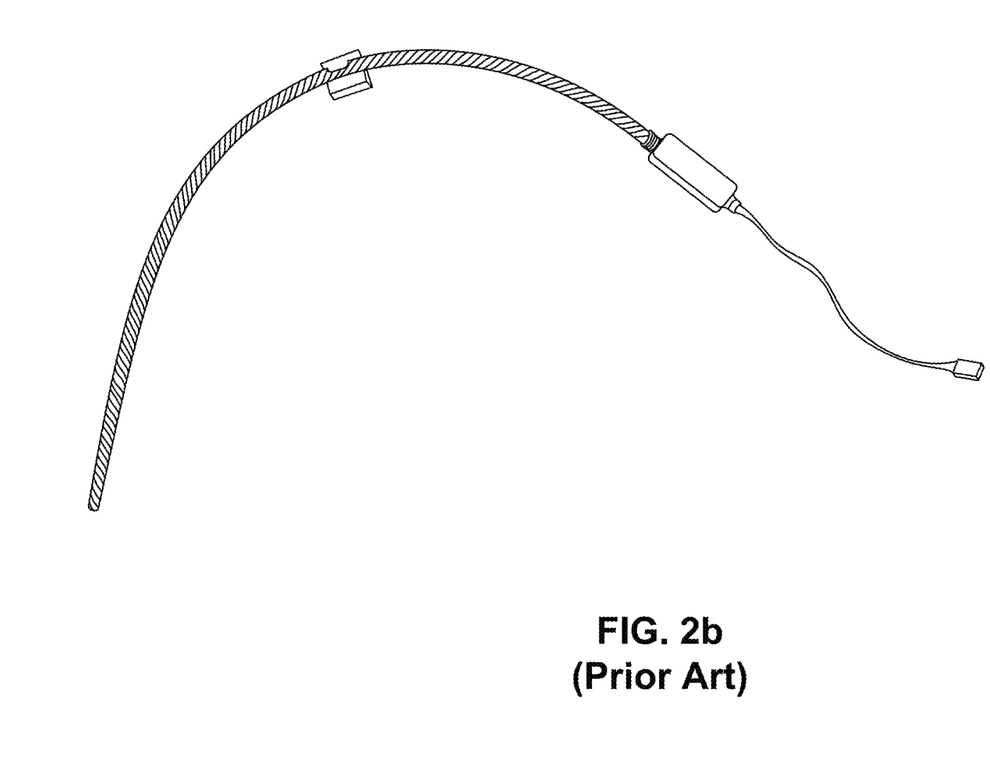
FIG. 2b shows a liquid detecting rope (prior art)

A current technique for detecting leaks, depicted in FIG. 2b, is a "rope" having exposed wires that are threaded along the run length of the rope. When the rope is dry the exposed wires are isolated from one another by the insulating rope strands. The rope can be laid within an electrical system or rack. If liquid drips or runs onto the rope it will wet the rope which, in turn, will form a short circuit between the exposed wires. Thus, the leak is detected by a change is resistance path between the wires (which generates an alarm). A problem with the rope is that it is generally cumbersome to use. It can be difficult to adequately lay the rope through small form factor or otherwise tight regions of space which limits its ability to be placed in a location where it will come into contact with leaking fluid. Moreover the rope does not provide any specific information as to where the source of the leak is.

Figure 3A:
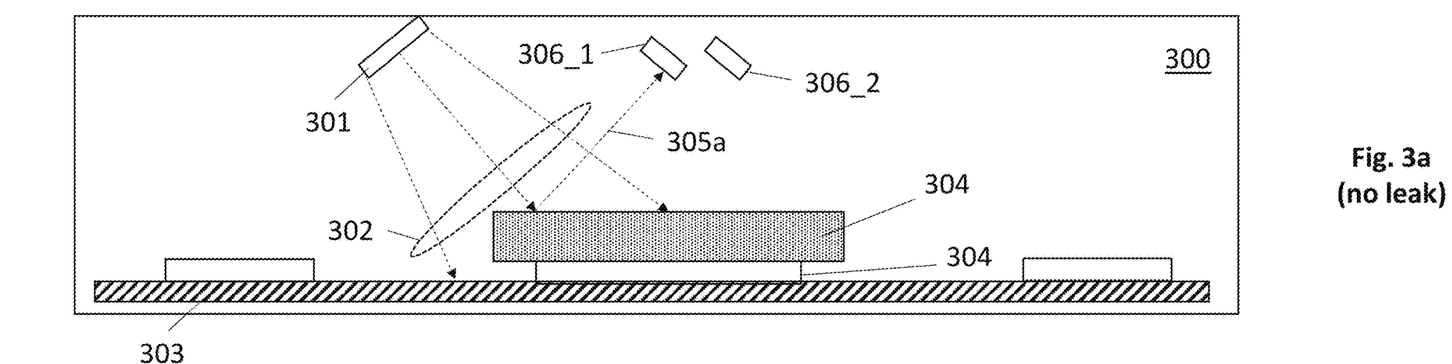
FIGS. 3a and 3b depict an embodiment of optical leak detection.
Figure 3B:
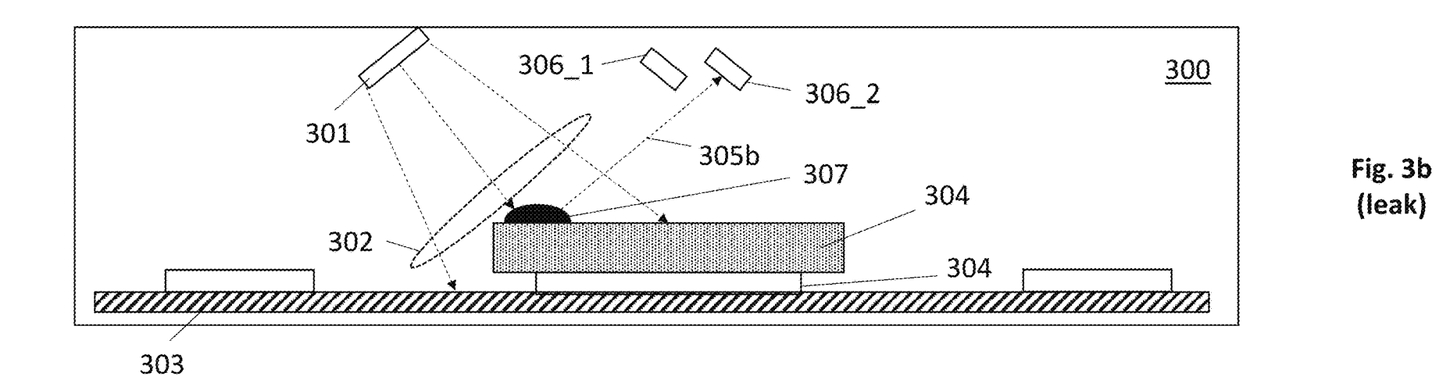

FIGS. 3a and 3b depict an improved technique that employs optical leak detection. Here, a light source 301 (e.g., a light emitting diode) shines light 302 onto a printed circuit board (motherboard) 303 and its associated components 304 within an electronic system 300. Ideally, the emitted light 302 falls upon one or more regions where leaking coolant will be present if a leak were to develop (e.g., cold plate, hose junctions, etc.).

During normal operation without leaks, as observed in FIG. 3a, the emitted light 302 has a reflection profile that is characteristic of the specific structure 304 that exists on the motherboard surface 303 when no leaks are present. Here, there are certain physical structures 304 (e.g., packaged semiconductor chips, cooling system components, motherboard surface area between components, etc.) that reside within the area 302 that is illuminated by the light (also referred to as an "illumination field"). The emitted light reflects off these physical structures in a scattered or diffused fashion as a consequence, at least in part, of the three dimensional nature of the structures 304 in the illumination field 302.

One or more photosensitive elements 306 (e.g., photodetectors, image sensors, etc.) are positioned to sense the scattered, reflected light (for ease of illustration, FIG. 3a only shows one ray 305a of the reflected light). Notably, the scattered, reflected light will have a specific intensity profile over the area that the reflected light shines through that is particular to the structures in the illumination field, their respective reflectivity and the emitted light's angle of incidence upon the structures. The reflected intensity profile generally should not change much, if at all, during nominal operation of the electronic system over time (the emitted light and its reflection generally remain constant over extended operation of the electronic system). In the example of FIG. 3a, the constant reflection without a leak is exemplified by ray 305a.

If a leak 307 suddenly develops in the liquid cooling system however, referring to FIG. 3b, the intensity profile of the reflection will change. Here, portions of light within the illumination field 302 that suddenly impinge upon leaking coolant (rather than whatever structure is beneath the leaking coolant) will, e.g., refract (change direction) within the fluid before reaching the underlying structure that the leaking coolant has leaked upon.

This change of direction essentially changes the angle of incidence of the incident light with the underlying structure as compared to when no leak is present. The change in the angle of incidence results in a change in the direction of reflection off of the structure, which, in turn, changes the intensity profile of the reflected light. As observed in FIGS. 3a and 3b, again as an example, reflected ray 305a of FIG. 3a changes its reflection angle to that of ray 305b of FIG. 3b.

As such, a first photodetector 306_1 can receive less light after the leak develops and/or a second photodetector 306_2 can receive more light after the leak develops. The former will be experienced by a photodetector 306_1 that receives reflected light 305a from the region of the leak when no leak is present but then does not receive the reflected light 305b, e.g., owing to the change in reflection angle, after the leak develops. The latter will be experienced by a photodetector 306_2 that does receive reflected light 305a when no leak is present but suddenly receives reflected light 305b, e.g., owing to the change in reflection angle, when the leak emerges.

Any such changes detected by one or more photodetectors 306_1, 306_2 can be used as a basis for recognizing the existence of a leak and raising an alarm signal in response.

Apart from changes in orientation of reflected rays, other phenomena associated with the reflection can change as a consequence of the leak that can also be detected to recognize that a leak exists in the system 300.

For example, some percentage of the emitted light 302 will reflect off the leaking coolant liquid 307 which essentially creates a new reflection "signal" that did not exist before the leak developed. Here, as is understood in the art, whenever the medium through which light propagates is changed, some percentage of the light reflects off the interface between the two different media and the remaining percentage refracts into the new medium.

Thus, in the case of no leak, there is no change in medium (light propagates continuously through an air medium until it impinges upon the motherboard structure 304). However, in the presence of a leak, there will be a medium change from air to leaked coolant fluid 307 just above the motherboard structure 304. The reflection off of the coolant surface 307 (not shown in FIG. 3b for illustrative ease) will therefore create a new signal of reflected light that did not exist before the leak developed. The sudden appearance of this signal in response to the leak can also be detected by the one or more photodetectors 306_1, 306_2 and used as a basis for recognizing the existence of the leak.

Further still, in at least some embodiments, the photodetectors 306_1, 306_2 are sensitive to the color of the coolant, and, the coolant is a specific color that is not readily present when no leak is present. That is, for example, the motherboard 303 and the structures 304 that are mounted to the motherboard 303 generally do not posses the color of the coolant 307. As such, when the coolant 307 begins to leak, one or more photodetectors sense 306_1, 306_1 the sudden appearance of the coolant's color and raise an alarm signal in response (in the example of FIG. 3b, suddenly a block spot 307 appears in the view of the photodetectors 307a, 307b).

Alternatively or in combination, the photodetectors are sensitive to the color of the coolant and the color of the emitted light (e.g., if the emitted light is yellow and the coolant is red, the photodetectors are designed to sense the color orange (which is created when the yellow light shines on the red coolant).

Figure 4A:
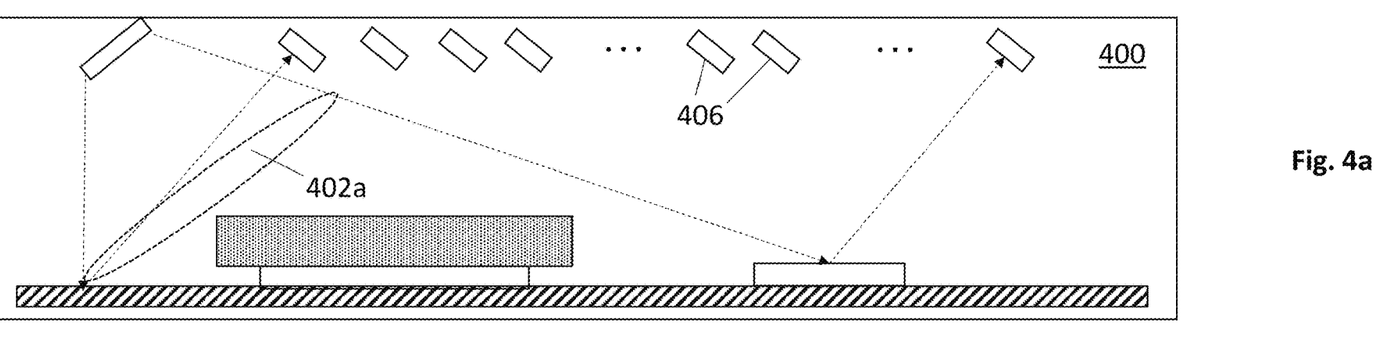
FIGS. 4a and 4b show different mechanical designs for an optical leak detection apparatus.
Figure 4B:
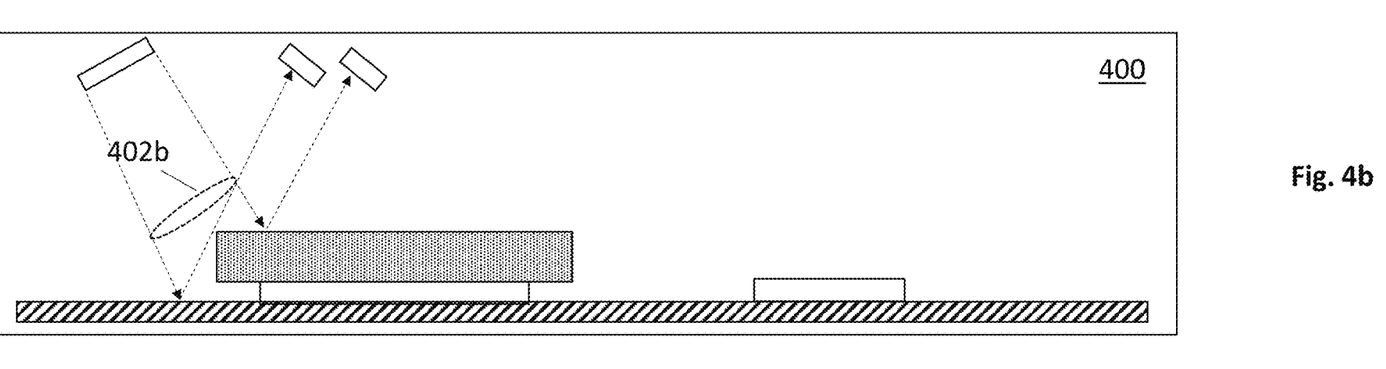

FIGS. 4a and 4b show different embodiments of optical designs to effect optical leak detection consistent with the discussion provided just above.

In general, as observed in FIG. 4a, optical leak detection can be "course grained" in that a single illumination field covers a wide area and/or multiple locations of a liquid cooling system where a leak could occur. Correspondingly, if a leak is detected from a change in the reflection from the illumination field, a leak is known to exist somewhere in the illumination field, but, exactly where is not known.

However, some degree of image processing intelligence can be coupled to multiple photosensitive elements (e.g., multiple photodetectors, one or more image sensors, etc.) outputs to process their collective output information (the image of the reflection) and detect the presence of a leak. Such image processing intelligence could conceivably identify a particular location of a leak even though the illumination field covers multiple locations where a leak could occur. For example, if an array of photodetectors 406 (e.g., a two dimensional array) is used to process the reflected image, not only could the appearance of a "dark spot" in the image be used to flag the existence of a leak, but also, the location of the spot within the array could be used to identify the location of the leak.

Alternatively, as observed in FIG. 4b, optical leak detection can be "fine grained" in that an illumination field is deliberately sized and shaped to illuminate a specific area of a coolant system. Here, it has been observed that leaks tend to appear at junctions of the fluidic system. For example, a hose connection to any of the following are regions of a cooling system where is more apt to develop: 1) inlet; 2) an outlet; 3) a manifold; 4) a cold plate; 5) a heat exchanger; 6) another hose (e.g., with a quick connect quick disconnect (QDQD)), etc.

As such, in various embodiments, e.g., multiple illumination fields are created to individually illuminate, e.g., multiple, specific junctions. Here, leak detection is fine grained because sensing the presence of a leak from the reflected signal from a particular illumination field also identifies the location of the leak (e.g., the specific junction that the field of illumination illuminates).

Various systems can combine various ones of the above techniques. For example, wide areas of a motherboard may be illuminated for general leak detection (perhaps with arrays of photodetectors and subsequence image processing to effect finer grained leak detection) while certain critical junctions in the coolant system may be illuminated for junction specific leak detection.

Regardless, generally, one or more photodetectors 406 are positioned in strategic locations within the system 400 where changes in the reflection from a particular illumination field will be apparent if a leak occurs within the illumination field. The strategic locations can be customized based on an understanding/characterization of specific features of the pre and post leak reflected signals, and/or, be arranged more like an array that collects reflected signal information, e.g., uniformly over an area (e.g., as with an image sensor).

In various embodiments there is at least one light source for each specific illumination field and at least one photodetector for each illumination field. Different illumination fields can be illuminated with different colors to separate the spectra of the different reflection signals. Here, a first group of photodetectors that are sensitive to a first color process a first reflection signal from a first illumination field whereas a second group of photodetectors that are sensitive to a second color process a second reflection signal from a second illumination field.

The light sources and/or photosensitive elements can be mounted on the inner face of the system chassis, and/or, other mechanical features within the chassis that can support a light source or photodetector (e.g., a post, a ridge, a frame, etc.).

The electronics that process the output signal(s) from the photosensitive element(s) can be integrated on a printed circuit board within the system such as the same printed circuit board that is illuminated to detect leaks. Here, electrical wiring is run, e.g., by way of jumper connectors/cables, between the photosensitive elements and the printed circuit board.

It is pertinent to point out that a PCB board having any of a number of different high performance semiconductor chips could exhibit warpage (and therefore make use of the teachings herein) because of the power consumption of the semiconductor chips and/or loading and/or thermal mismatches caused by their associated packaging.

Examples include processors (CPUs), (e.g., system-on-chip, accelerator chip (e.g., neural network processor), graphics processing unit (GPU), general purpose graphics processing unit (GPGPU), field programmable gate array (FPGA), application specific integrated circuit (ASIC)), an "X" processing unit ("XPU") where "X" can be any processor other than a general purpose processor (e.g., etc. G for graphics, D for data, I for infrastructure, etc.).

A PCB board that makes use of the teachings herein can be integrated into a chassis having dimensions that are compatible with an industry standard rack (such as racks having 19" or 23" widthwise openings and having mounting holes for chassis having heights of specific height units (e.g., 1 U, 2 U, 3 U where U=1.75"). One example is the IEC 60297 Mechanical structures for electronic equipment—Dimensions of mechanical structures of the 482.6 mm (19 in) series. Generally, however, a chassis of any dimension is possible.

The electrical I/Os of the chip package to motherboard connections described above may be compatible with or used to transport signals associated with various data center computing and networking system interconnect technologies. Examples include, e.g., data and/or clocking signals associated with any of Infinity Fabric (e.g., as associated and/or implemented with AMD products) or derivatives thereof, specifications developed by the Cache Coherent Interconnect for Accelerators (CCIX) consortium or derivatives thereof, specifications developed by the GEN-Z consortium or derivatives thereof, specifications developed by the Coherent Accelerator Processor Interface (CAPI) or derivatives thereof, specifications developed by the Compute Express Link (CXL) consortium or derivatives thereof, specifications developed by the Hyper Transport consortium or derivative thereof, Ethernet, Infiniband, NVMe-oF, PCIe, etc.

A PCB board that makes use of the teachings provided above, and/or the PCB board's associated electronic system, may contain the primary components of an entire computer system (e.g., CPU, main memory controller, main memory, peripheral controller and mass non-volatile storage), or, may contain the functionality of just some subset of an entire computer system (e.g., a chassis that contains primarily CPU processor power, a chassis that contains primarily main memory control and main memory, a chassis that contains primarily a storage controller and storage). The later can be particularly useful for dis-aggregated computing systems.

In the case of a dis-aggregated computer system, unlike a traditional computer in which the core components of a computing system (e.g., CPU processors, memory, storage, accelerators, etc.) are all housed within a common chassis and connected to a common motherboard, such components are instead integrated on separate pluggable cards or other pluggable components (e.g., a CPU card, a system memory card, a storage card, an accelerator card, etc.) that plug-into a larger exposed backplane or network instead of a same, confined motherboard. As such, for instance, CPU computer power can be added by adding CPU cards to the backplane or network, system memory can be added by adding memory cards to the backplane or network, etc. Such systems can exhibit even more high speed card to card connections that traditional computers. One or more dis-aggregated computers and/or traditional computers/servers can be identified as a Point of Delivery (PoD) for computing system function in, e.g., the larger configuration of an information technology (IT) implementation such as a data center.

Figure 5:
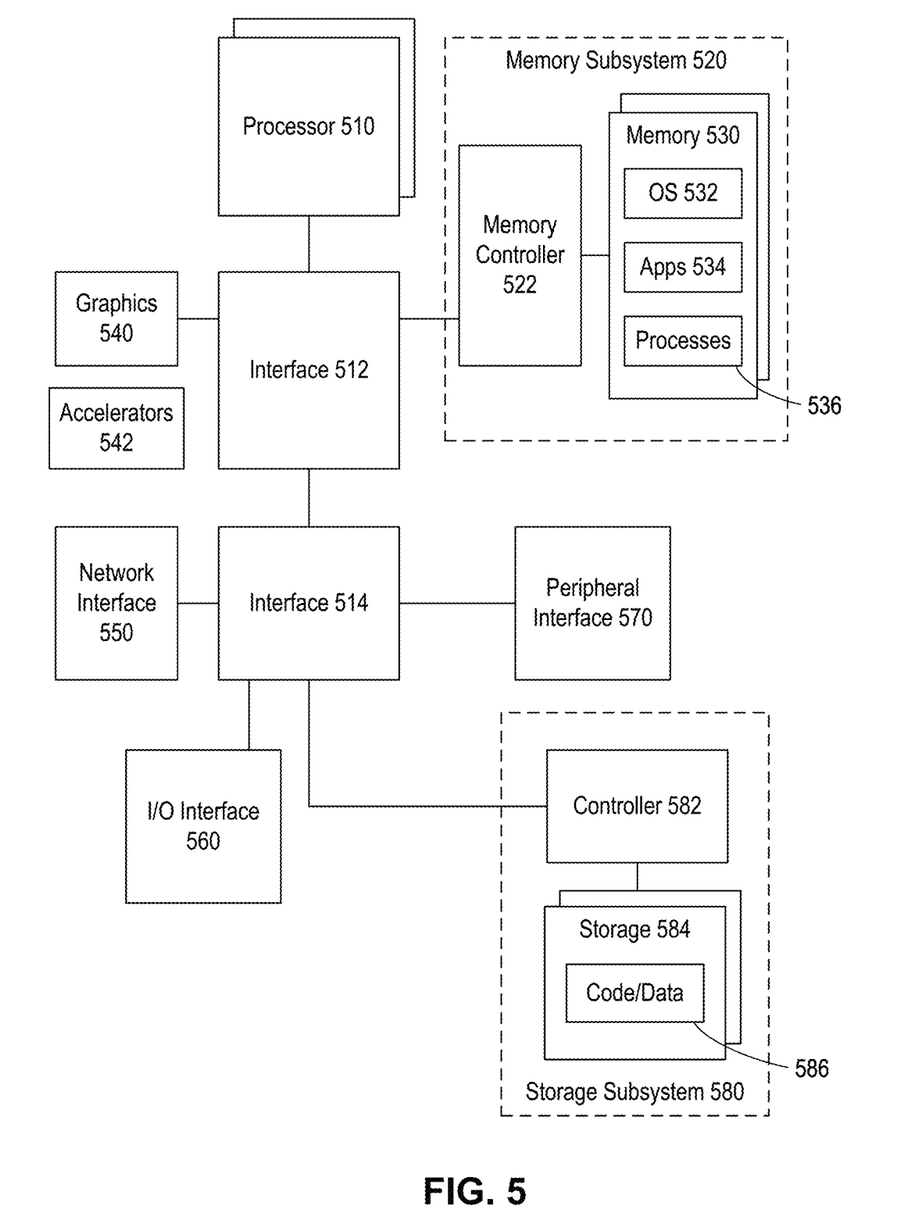
FIG. 5 shows a computing system.

FIG. 5 depicts an example system. The system can use embodiments described herein to determine a reference voltage to apply to a rank of memory devices and a timing delay of a chip select (CS) signal sent to the rank of memory devices. System 500 includes processor 510, which provides processing, operation management, and execution of instructions for system 500. Processor 510 can include any type of microprocessor, central processing unit (CPU), graphics processing unit (GPU), processing core, or other processing hardware to provide processing for system 500, or a combination of processors. Processor 510 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 500 includes interface 512 coupled to processor 510, which can represent a higher speed interface or a high throughput interface for system components that needs higher bandwidth connections, such as memory subsystem 520 or graphics interface components 540, or accelerators 542. Interface 512 represents an interface circuit, which can be a standalone component or integrated onto a processor die. Where present, graphics interface 540 interfaces to graphics components for providing a visual display to a user of system 500. In one example, graphics interface 540 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 540 generates a display based on data stored in memory 530 or based on operations executed by processor 510 or both. In one example, graphics interface 540 generates a display based on data stored in memory 530 or based on operations executed by processor 510 or both.

Accelerators 542 can be a fixed function offload engine that can be accessed or used by a processor 510. For example, an accelerator among accelerators 542 can provide compression (DC) capability, cryptography services such as public key encryption (PKE), cipher, hash/authentication capabilities, decryption, or other capabilities or services. In some embodiments, in addition or alternatively, an accelerator among accelerators 542 provides field select controller capabilities as described herein. In some cases, accelerators 542 can be integrated into a CPU socket (e.g., a connector to a motherboard or circuit board that includes a CPU and provides an electrical interface with the CPU). For example, accelerators 542 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 542 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 520 represents the main memory of system 500 and provides storage for code to be executed by processor 510, or data values to be used in executing a routine. Memory subsystem 520 can include one or more memory devices 530 such as read-only memory (ROM), flash memory, volatile memory, or a combination of such devices. Memory 530 stores and hosts, among other things, operating system (OS) 532 to provide a software platform for execution of instructions in system 500. Additionally, applications 534 can execute on the software platform of OS 532 from memory 530. Applications 534 represent programs that have their own operational logic to perform execution of one or more functions. Processes 536 represent agents or routines that provide auxiliary functions to OS 532 or one or more applications 534 or a combination. OS 532, applications 534, and processes 536 provide software logic to provide functions for system 500. In one example, memory subsystem 520 includes memory controller 522, which is a memory controller to generate and issue commands to memory 530. It will be understood that memory controller 522 could be a physical part of processor 510 or a physical part of interface 512. For example, memory controller 522 can be an integrated memory controller, integrated onto a circuit with processor 510. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

While not specifically illustrated, it will be understood that system 500 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), a universal serial bus (USB), or an Institute of Electrical and Electronics Engineers (IEEE) standard 1394 bus.

In one example, system 500 includes interface 514, which can be coupled to interface 512. In one example, interface 514 represents an interface circuit, which can include standalone components and integrated circuitry. In one example, multiple user interface components or peripheral components, or both, couple to interface 514. Network interface 550 provides system 500 the ability to communicate with remote devices (e.g., servers or other computing devices) over one or more networks. Network interface 550 can include an Ethernet adapter, wireless interconnection components, cellular network interconnection components, USB (universal serial bus), or other wired or wireless standards-based or proprietary interfaces. Network interface 550 can transmit data to a remote device, which can include sending data stored in memory. Network interface 550 can receive data from a remote device, which can include storing received data into memory. Various embodiments can be used in connection with network interface 550, processor 510, and memory subsystem 520.

In one example, system 500 includes one or more input/output (I/O) interface(s) 560. I/O interface 560 can include one or more interface components through which a user interacts with system 500 (e.g., audio, alphanumeric, tactile/touch, or other interfacing). Peripheral interface 570 can include any hardware interface not specifically mentioned above. Peripherals refer generally to devices that connect dependently to system 500. A dependent connection is one where system 500 provides the software platform or hardware platform or both on which operation executes, and with which a user interacts.

In one example, system 500 includes storage subsystem 580 to store data in a nonvolatile manner. In one example, in certain system implementations, at least certain components of storage 580 can overlap with components of memory subsystem 520. Storage subsystem 580 includes storage device(s) 584, which can be or include any conventional medium for storing large amounts of data in a nonvolatile manner, such as one or more magnetic, solid state, or optical based disks, or a combination. Storage 584 holds code or instructions and data 586 in a persistent state (e.g., the value is retained despite interruption of power to system 500). Storage 584 can be generically considered to be a "memory," although memory 530 is typically the executing or operating memory to provide instructions to processor 510. Whereas storage 584 is nonvolatile, memory 530 can include volatile memory (e.g., the value or state of the data is indeterminate if power is interrupted to system 500). In one example, storage subsystem 580 includes controller 582 to interface with storage 584. In one example controller 582 is a physical part of interface 514 or processor 510 or can include circuits or logic in both processor 510 and interface 514.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 500. More specifically, power source typically interfaces to one or multiple power supplies in system 700 to provide power to the components of system 500. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 500 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Figure 6:
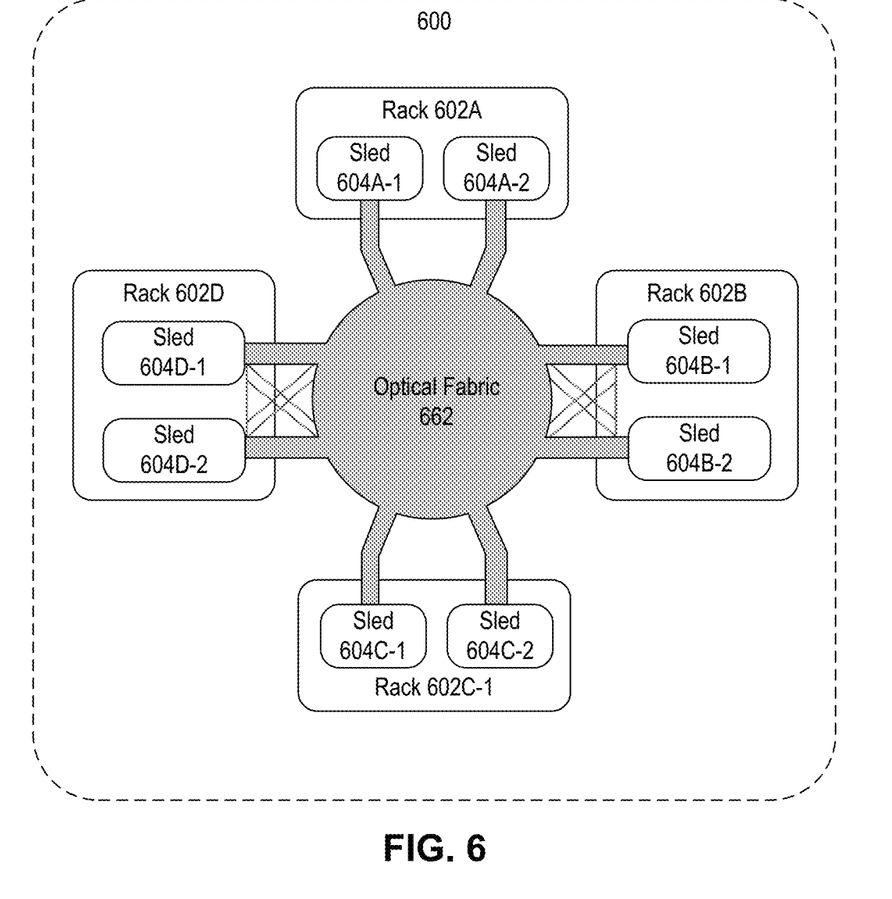
FIG. 6 shows a data center.

FIG. 6 depicts an example of a data center. Various embodiments can be used in or with the data center of FIG. 6. As shown in FIG. 6, data center 600 may include an optical fabric 612. Optical fabric 612 may generally include a combination of optical signaling media (such as optical cabling) and optical switching infrastructure via which any particular sled in data center 600 can send signals to (and receive signals from) the other sleds in data center 600. However, optical, wireless, and/or electrical signals can be transmitted using fabric 612. The signaling connectivity that optical fabric 612 provides to any given sled may include connectivity both to other sleds in a same rack and sleds in other racks. Data center 600 includes four racks 602A to 602D and racks 602A to 602D house respective pairs of sleds 604A-1 and 604A-2, 604B-1 and 604B-2, 604C-1 and 604C-2, and 604D-1 and 604D-2. Thus, in this example, data center 600 includes a total of eight sleds. Optical fabric 612 can provide sled signaling connectivity with one or more of the seven other sleds. For example, via optical fabric 612, sled 604A-1 in rack 602A may possess signaling connectivity with sled 604A-2 in rack 602A, as well as the six other sleds 604B-1, 604B-2, 604C-1, 604C-2, 604D-1, and 604D-2 that are distributed among the other racks 602B, 602C, and 602D of data center 600. The embodiments are not limited to this example. For example, fabric 612 can provide optical and/or electrical signaling.

Figure 7:
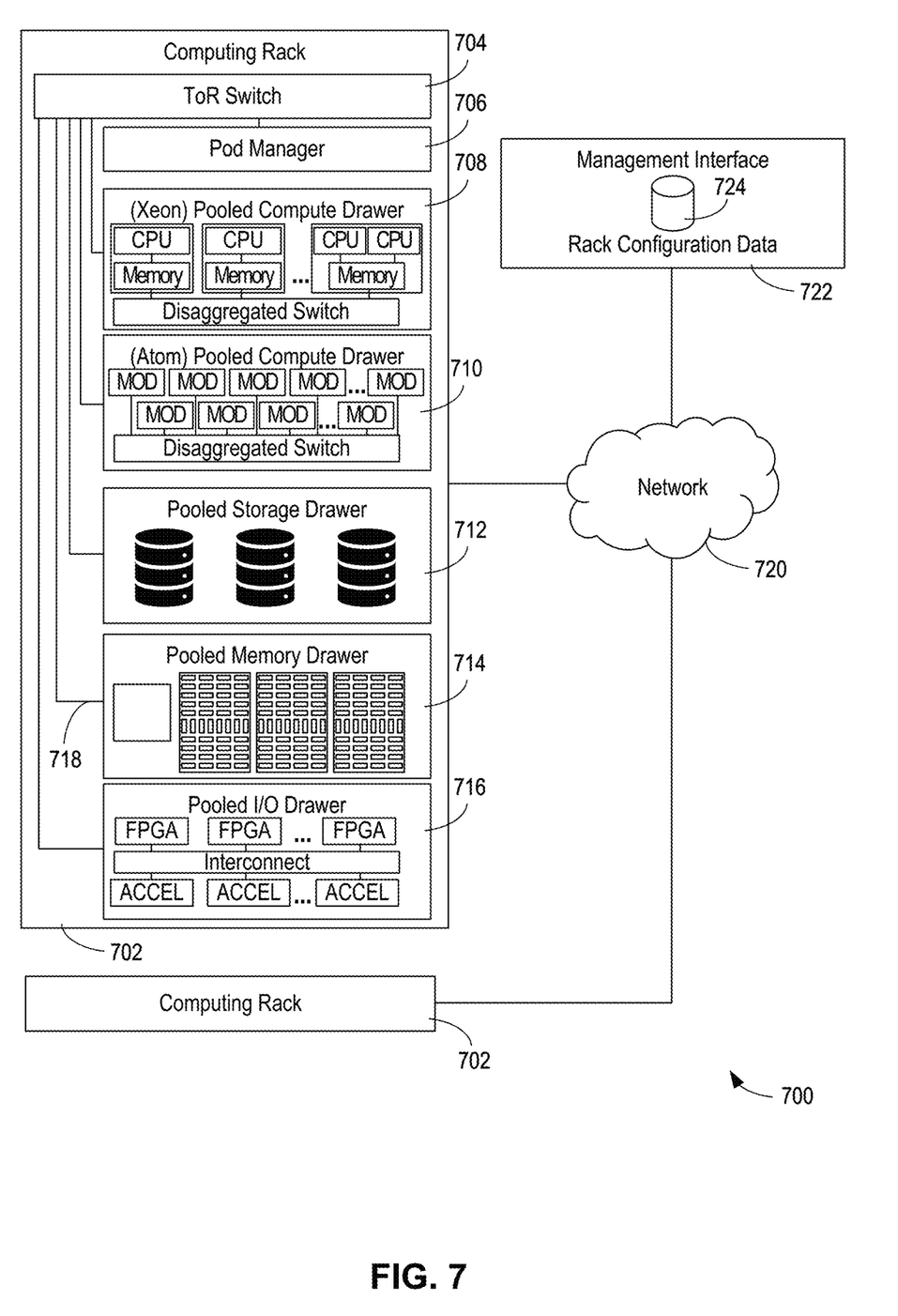
FIG. 7 shows a rack.

FIG. 7 depicts an environment 700 includes multiple computing racks 702, each including a Top of Rack (ToR) switch 704, a pod manager 706, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 708, and INTEL® ATOM™ pooled compute drawer 210, a pooled storage drawer 212, a pooled memory drawer 214, and an pooled I/O drawer 716. Each of the pooled system drawers is connected to ToR switch 704 via a high-speed link 718, such as a 40 Gigabit/second (Gb/s) or 100 Gb/s Ethernet link or an 100+Gb/s Silicon Photonics (SiPh) optical link. In one embodiment high-speed link 718 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 700 may be interconnected via their ToR switches 704 (e.g., to a pod-level switch or data center switch), as illustrated by connections to a network 720. In some embodiments, groups of computing racks 702 are managed as separate pods via pod manager(s) 706. In one embodiment, a single pod manager is used to manage all of the racks in the pod. Alternatively, distributed pod managers may be used for pod management operations.

RSD environment 700 further includes a management interface 722 that is used to manage various aspects of the RSD environment. This includes managing rack configuration, with corresponding parameters stored as rack configuration data 724.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

What is claimed:

1. An apparatus, comprising:
a printed circuit board with electronic components mounted thereon, at least one of the electronic components coupled to a liquid cooling system;
a light source; and
a plurality of photosensitive elements, the light source to illuminate a region of the printed circuit board, wherein a first one of the photosensitive elements is to detect a first reflection from the region corresponding to a lack of a presence of coolant from the liquid cooling system in the region, and wherein a second one of the photosensitive elements spaced apart from the first one of the photosensitive elements is to detect a second reflection from the region corresponding to the presence of the coolant in the region.

2. The apparatus of claim 1, wherein at least one of the photosensitive elements is a photodetector.

3. The apparatus of claim 1, wherein at least one of the photosensitive elements is an image sensor.

4. The apparatus of claim 1, wherein the region includes a junction of the liquid cooling system.

5. The apparatus of claim 4, wherein the junction is between a first hose and at least one of the following components of the liquid cooling system:
an inlet;
an outlet;
a manifold;
a cold plate;
a heat exchanger; or
a second hose.

6. The apparatus of claim 1, wherein the region includes multiple junctions of the liquid cooling system.

7. The apparatus of claim 6, wherein the system includes:
machine-readable instructions, and
at least one processor circuit to execute the instructions to identify which of the junctions is the source of the coolant that has leaked from the liquid cooling system.

8. The apparatus of claim 1, wherein a third one of the photosensitive elements is to detect a third reflection from the region based on the presence of the coolant in the region.

9. The apparatus of claim 8, further including:
machine-readable instructions, and
at least one processor circuit to execute the instructions to determine a position of a leak based on whether the second reflection or the third reflection is detected.

10. The apparatus of claim 1, further including:
machine-readable instructions, and
at least one processor circuit to execute the instructions to determine a degree of a leak based on an amount of light reflected toward the second one of the photosensitive elements.

11. A data center, comprising:
multiple racks;
multiple electronic systems mounted to the multiple racks;
at least one optical link, at least some of the multiple electronic systems being communicatively coupled through the at least one optical link; and
an electronic system including:
a printed circuit board with electronic components mounted thereon, at least some of the electronic components coupled to components of a liquid cooling system,
a light source to illuminate a region of the printed circuit board, and
a plurality of photosensitive elements, wherein a first one of the photosensitive elements is to detect a first reflection from the region corresponding to a lack of a presence of coolant from the liquid cooling system in the region, and wherein a second one of the photosensitive elements spaced apart from the first one of the photosensitive elements is to detect a second reflection from the region corresponding to the presence of the coolant in the region.

12. The data center of claim 11, wherein at least one of the photosensitive elements is a photodetector.

13. The data center of claim 11, wherein at least one of the photosensitive elements is an image sensor.

14. The data center of claim 11, wherein the region includes a junction of the liquid cooling system.

15. The data center of claim 14, wherein the junction is between a first hose and at least one of the following components of the liquid cooling system:
an inlet;
an outlet;
a manifold;
a cold plate;
a heat exchanger; or
a second hose.

16. The data center of claim 11, wherein the region includes multiple junctions of the liquid cooling system.

17. The data center of claim 16 wherein the system includes electronics to identify which of the multiple junctions is the source of the coolant that has leaked from the liquid cooling system.

18. A method, comprising:
illuminating a region of a printed circuit board having at least one electronic component within an electronic system, the electronic system comprising components of a liquid cooling system;
detecting, with a plurality of photosensitive elements, light reflected from the region in the liquid cooling system; and
determining a presence of a leak based on a change in the light reflected from the region after the leak develops in the liquid cooling system, wherein a first one of the photosensitive elements is to detect a first reflection from the region corresponding to a lack of a presence of coolant from the liquid cooling system in the region, and wherein a second one of the photosensitive elements spaced apart from the first one of the photosensitive elements is to detect a second reflection from the region corresponding to the presence of the coolant in the region.

19. The method of claim 18, wherein the detecting is performed with a photodetector.

20. The method of claim 18 wherein the region includes a junction of the liquid cooling system.

* * * * *